United States Patent [19]

Adler et al.

[11] Patent Number: 4,963,951
[45] Date of Patent: Oct. 16, 1990

[54] LATERAL INSULATED GATE BIPOLAR TRANSISTORS WITH IMPROVED LATCH-UP IMMUNITY

[75] Inventors: Michael S. Adler; Deva N. Pattanayak, both of Schenectady, N.Y.

[73] Assignee: General Electric Company, Schenectady, N.Y.

[21] Appl. No.: 803,049

[22] Filed: Nov. 29, 1985

[51] Int. Cl.$^5$ .................... H01L 29/74; H01L 27/02; H01L 29/80; H01L 29/40
[52] U.S. Cl. ........................... 357/23.7; 357/38; 357/43; 357/22; 357/53
[58] Field of Search ............ 357/22, 38, 43, 86, 357/52, 53

[56] References Cited

U.S. PATENT DOCUMENTS

| | | |
|---|---|---|
| 3,697,830 | 10/1972 | Dale . |
| 4,199,774 | 4/1980 | Plummer . |
| 4,300,150 | 11/1981 | Colak ........................... 357/23.8 |
| 4,364,073 | 12/1982 | Becke et al. . |
| 4,409,606 | 10/1983 | Wagenaar et al. ........... 357/23.8 |
| 4,443,931 | 4/1984 | Baliga et al. . |
| 4,503,598 | 3/1985 | Uora et al. ................... 357/23.4 |
| 4,529,456 | 7/1985 | Anzai et al. .................. 357/23.8 |
| 4,532,534 | 6/1985 | Ford et al. . |
| 4,587,713 | 5/1986 | Goodman et al. ............. 357/23.4 |
| 4,609,929 | 9/1986 | Jayaraman et al. ............ 357/23.4 |
| 4,639,761 | 1/1987 | Singer et al. .................. 357/43 |

FOREIGN PATENT DOCUMENTS

| | | |
|---|---|---|
| 0111803 | 12/1983 | European Pat. Off. . |
| 57-211778 | 12/1982 | Japan ............................ 357/23.8 |
| 1400574 | 8/1971 | United Kingdom . |
| 2156151A | 3/1985 | United Kingdom . |

OTHER PUBLICATIONS

A. Goodman et al., "Improved COMFETS . . . ," 1983, IEDM Conf. Proc., 83CH1973-7, pp. 79-82.
Darwish, M. et al., "Lateral Resurfed COMFET", *Electronic Letters*, vol. 20, No. 12, Jun. 1984, pp. 519-520.
Robinson, A. L. et al., "Lateral Insulated Gate Transistors with Improved Latching Characteristics", *IEEE Electronic Device Letters*, vol. EDL-7, No. 2, Feb. 1986, pp. 61-63.
Pattanayak, D. N. et al., "Analysis of Current Flow in Lateral Insulated Gate Transistors", *IEEE Transactions on Electron Devices*, vol. ED-32, No. 11, Nov. 1985, p. 2555.
Plummer et al., "Insulated-Gate Planar Thyristors: 1-Structure and Basic Operation", IEEE Transactions on Electron Devices, Feb. 1980, vol. ED-27, pp. 380-387.

*Primary Examiner*—Rolf Hille
*Assistant Examiner*—Wael Fahmy
*Attorney, Agent, or Firm*—Robert Ochis; James C. Davis, Jr.; Marvin Snyder

[57] ABSTRACT

The present invention relates generally to insulated gate transistors and more particularly, to laterally implemented insulated gate transistors having improved current capacity and improved immunity to latch-up. Specifically, it has been found that a lateral insulated gate transistor fabricated on a heavily doped substrate such as a p+ substrate exhibits improved current density. Further, the inclusion of an additional heavily doped region such as a P+ region proximate the base region contributes to improved latch-up immunity within the device.

6 Claims, 8 Drawing Sheets

CURRENT DENSITY VS. FORWARD DROP
GATE VOLTAGE = 20 V

FIG. 9

CURRENT DENSITY VS. FORWARD DROP
GATE VOLTAGE = 40 V

FIG. 10

SCHEMATIC DIAGRAM OF A LATERAL IGT
WITH BURIED LAYER

LATERAL INSULATED GATE BIPOLAR TRANSISTORS WITH IMPROVED LATCH-UP IMMUNITY

The present invention relates generally to insulated gate transistors and more particularly, to laterally implemented insulated gate transistors having improved current capacity and improved immunity to latch-up.

BACKGROUND OF THE INVENTION

Heretofore, lateral insulated gate transistors have been fabricated on semiconductor substrates which are either lightly doped, or moderately doped but not heavily doped. Various forms of vertical insulated gate transistors are disclosed in commonly-assigned U.S. Patent application Ser. No. 212,181 filed Dec. 2, 1980 by B. J. Baliga and entitled "Gate Enchanced Rectifier", now abandoned in favor of continuation application Ser. No. 483,009 incorporated by reference herein. As described in detail in the above application, an insulated gate transistor is a semiconductor device having an insulated gate for controlling the flow of carriers in an induced channel between the primary terminals of the device such as the anode and cathode terminals. The type of device which is referred to herein as an "insulated gate transistor" now has the official JEDEC designation "insulated gate bipolar transistor" or "IGBT." The gate establishes a conduction channel, the maximum capacity of which limits the maximum carrier current that can be carried by the device. The basic insulated gate transistor has both forward and reverse blocking capability. Current conduction in the forward direction can be controlled by the insulated gate which establishes the channel. The voltage applied to the insulated gate establishes the current capacity of the channel, and hence, the maximum carrier current that can be carried by the device. The insulated gate transistor is a bilateral device and employs conduction by both holes and electrons which contribute to the total current flow in the device. The channel is located adjacent one surface of the device and controllably supplies a flow of current of one type charge carrier to the drift region of the device while a heavily doped region located on the opposite surface of the device, supplies charge carriers of the opposite conductivity to the drift region. The carriers recombine in the drift region establishing a current flow across the device in response to appropriately applied bias potentials.

Heretofore circuit applications for lateral implementations of this device have been somewhat limited in view of the predisposition of this lateral type device to latch into uncontrolled current conduction. Further, the level of current conduction achieved before the occurrence of latch-up by these prior lateral embodiments was insufficient.

BRIEF SUMMARY OF THE INVENTION

It is an object of the present invention to provide an improved lateral insulated gate transistor exhibiting an improved current conducting capability, and more particularly, an increased level of current conduction prior to latch-up.

It is another object of the present invention to provide a lateral insulated gate transistor with improved latch-up immunity.

It is still a further object of the present invention to provide a lateral insulated gate transistor which exhibits improved current density and immunity to latching and enables current to be conducted at higher levels than those levels provided by conventional devices.

In particular, and as discussed in detail below, it is an object of the present invention to increase the vertical component of current flowing in the device between the substrate and anode to provide an improved device having increased current capacity.

It is a further object of the present invention to reduce the portion of current flowing through the base resistance to similarly reduce the voltage drop along the base/source junction which otherwise would have been created by the unreduced current flow. A reduction of the base/source voltage drop reduces the possibility that the base/source junction will become forward biased. More particularly, a reduction of the portion of the total current which flows to the cathode through the base resistance allows the device as a whole to be operated at a proportionately higher current level because the same amount of current can flow through the base resistance before the base/source junction becomes forward biased and the devices latches. Thus, the latching threshold of the device can be increased by controlling the base current.

It is thus a further object of the present invention to provide a more attractive current path coupling the drift region to the cathode or source contact to divert current away from the source region and prevent the diverted current from contributing to the IR potential drop along the base/source junction. The resulting improvement allows the device to be operated at a high current level that is comparable to that attainable in conventional IGT vertical construction.

For proper consideration of the present invention, it is necessary to establish a clear meaning of certain terms. In a lateral insulated gate transistor, a P base region can be considered to have a current path for holes therethrough. In the context of the devices as a whole, if the gate induces an N type channel in a P region conducts majority carriers such as electrons, then the base region which conducts holes conducts minority carriers. The base minority carrier current path can be considered to have a lateral portion substantially parallel to the surface of the device and a transverse portion substantially transverse to the surface of the device.

In a further preferred embodiment, an additional region such as a buried region, is disposed adjacent to the base region to provide a high conductivity lateral current path spaced or separated away from the base region adjacent to the source, reducing the base/source voltage drop significantly. In this manner, all portions of the source base junction are maintained at a voltage level relative to the source which is less than the forward bias potential or injection threshold which when exceeded, causes the devices to enter regenerative latch-up triggering the inherent parasitic four layer path. In one interpretation, the buried region can be considered to establish a highly conductive current path substantially parallel to the surface of said device for coupling minority carriers in said drift region through said newly established lateral path to the portion of the minority carrier current path established in the base region substantially transverse to the surface of said device.

Briefly, the lateral insulated gate semiconductor device of the present invention having improved current conduction and improved latch-up immunity in a preferred embodiment comprises a heavily doped substrate of one type conductivity, a first lightly doped layer of one type conductivity disposed thereon, a second lightly doped layer of an opposite type conductivity disposed on the first layer and forming a portion of the surface of the device, a first region of opposite conductivity type disposed within the second layer and forming a portion of the device surface, a second heavily doped region of one conductivity type disposed within the first region and forming a portion of the surface of the device, a third region of one conductivity type disposed within the second layer and forming a portion of the surface, a fourth heavily doped region of opposite conductivity type disposed within the third region also forming a portion of the surface of the device. An insulation layer disposed on the surface of the device covering a portion of the third and fourth regions, a controllable gate electrode is disposed overlying a portion of the insulation layer in registry with the third and fourth regions and is responsive to an appropriate bias for inducing a channel in said third region. The channel when induced, has sufficient capacity and conductivity for conducting substantially all majority carrier portions of the majority or opposite conductivity type carrier current of said device.

An electrode is disposed over and in contact with the third and fourth regions shorting the third region to the fourth region to inhibit the establishment of a voltage potential between these regions to avoid the undesired forward biasing of the junction between the third and fourth regions and to consequently avoid the unwanted latching of the device. In addition, a means associated with the third or base region is provided to control the conduction of minority carriers through the base region between the second lightly doped layer and the source or cathode electrode. More particularly, in a first preferred embodiment, the conductivity of the base region is altered to provide a low resistance current path in a portion of the base laterally offset from the source region to reduce the IR voltage drop attributable to one type conductivity or minority carrier current flow through the base region thereby reducing the possibility that the junction between the base and source regions will become forward biased. In an alternate preferred embodiment, a further highly doped region of one type conductivity such as a buried region is disposed adjacent the base region and the drift region and provides a highly conductive current path spaced or separated from the base/source junction for conducting one type conductivity or minority carriers between said drift region and the electrode. More particularly, the further highly doped region has a high conductivity and minority or one type conductivity carriers flowing in the drift region and which might otherwise flow laterally in the base region are diverted to travel laterally through the highly conductive current path to traverse the buried region and traverse a major lateral portion of the base region by flowing in a current path substantially parallel to the surface of the device. Subsequently, the minority carriers are attracted to the cathode electrode through the base region in a direction substantially transverse to the surface of the device. Lateral current flow parallel to the surface of the device through the base region is substantially reduced by the addition of the further region and thus, the I component of the IR voltage drop along a major portion of the junction between the third and fourth regions is also reduced. Once again, the junction between the third and fourth regions is less likely to become forward biased.

As will be discussed in more detail below, current in the insulated gate transistor essentially comprises three primary components: majority or opposite type conductivity carrier current flowing from the cathode through the induced channel into the drift region toward the anode to recombine with minority or one type conductivity carriers injected by the anode into the drift region, lateral minority carrier current flowing from the anode through the drift and base regions to the cathode, and minority carrier current flowing in a vertical direction between the substrate and the anode. Vertical current flow of course, assumes that the substrate is connected to a sink or drain of carriers such as ground potential. The present invention recognizes that the addition of a P+ substrate provides an additional sink of minority carriers which reduces the substrate resistance, contributes substantially to the current flow in a vertical direction. Accordingly, the insulated gate transistor of the present invention provides for an increased level of current conduction as well as improved immunity to latching.

BRIEF DESCRIPTION OF THE DRAWINGS

The features of the present invention which are believed to be novel are specified with particularity in the appended claims. The invention itself, however, both as to organization and method of operation together with additional objects, features, and advantages of the insulated gate transistor of the present invention may be best understood by reference to the following detailed discussion when considered in combination with the accompanying drawings in which:

DETAILED DESCRIPTION OF THE PREFERRED EMBODIMENTS

The present invention is applicable to a broad range of lateral insulated gate transistors fabricated from a variety of different semiconductor materials. The ensuing description will disclose a preferred embodiment implemented in a silicon substrate because silicon devices or devices fabricated in silicon wafers make up an overwhelming majority of the semiconductor devices currently in use. Consequently, the most commonly encountered applications of the present invention will involve silicon substrate devices. Moreover, while the present description discusses a number of preferred embodiments directed to silicon substrate semiconductor devices, it is intended that these disclosures be considered as illustrative examples of the preferred embodiments of the present invention and not as a limitation on the applicability of the present invention. Further, while particularly preferred current density results can be achieved when, for instance, the device is fabricated on a highly doped substrate, the present invention is intended to encompass devices fabricated on other types of substrates such as dielectrically isolated substrates.

Given the corresponding relationship of FIGS. 1, 2, 3, 4, 5, 6, and 7 corresponding parts have been designated with the same reference numeral as an aid to understanding the description of the present invention.

In the figures, various parts of the semiconductor elements are not drawn to scale. Certain dimensions have been exaggerated in relation to other dimensions in order to present a clearer understanding of the invention. Although for the purposes of illustration, the preferred embodiment of the lateral insulated gate transistors have been shown to include a P+ substrate, P+ anode region, N buffer region, P base region and N+ cathode region, it is understood by those skilled in the art that the teachings herein are equally applicable to lateral insulated gate transistors in which the conductivities of the various regions have been reversed to provide an N+ substrate, N+ anode region, P buffer region N base region and P+ cathode region.

Further, although the embodiments illustrated herein are shown in two dimensional views with the various regions of the device having width and depth, it is to be understood that these regions are implemented as three dimensional regions having length, width, and depth. Moreover, it is to be further understood that the disclosure herein is centered primarily on a single cell and that actual devices commonly comprise a hundred or more cells.

Figure 1:
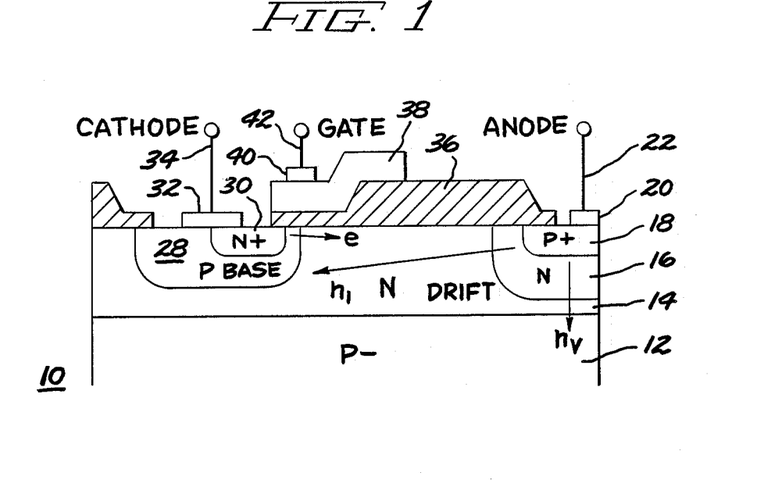
FIG. 1 is a cross-sectional illustration of a conventional insulated gate transistor.

Referring now to FIG. 1, the lateral insulated gate transistor 10 of a conventional type is shown in FIG. 1. The device comprises a lightly doped P substrate 12 having a N type layer 14 epitaxially disposed thereon. An N type buffer region 16 is disposed in the layer 14 and a P+ anode region 18 is disposed within the N buffer region 16. A metallized contact 20 is applied to the P+ anode region 18 and a terminal 22 is electrically connected to the metallized layer 20. On the cathode side of the device, a P base region 28 is disposed in the epitaxial layer 14 and an N+ cathode region 30 is disposed within the P base 28. A metal contact 32 is disposed over and in contact with the N+ cathode region 30 and the P base region 28 and serves as an electrical contact for each region and additionally shorts the source region 30 to the base region 28. A terminal 34 is applied to the cathode contact 32. The cathode portion of the device is separated from the anode portion of the device by a portion of the epitaxial layer which is designated as the N- drift layer. The surface of the device 10 is formed by a portion of the epitaxial layer 14, the anode region 18, the buffer region 16, the base region 28 and source region 30.

An insulation layer 36 is disposed over a portion of the base region 28 and a portion of the source region 30. A gate electrode is disposed over the insulation layer in registry with a portion of the base region 28 such that upon appropriate biasing, the gate 38 induces a channel in the base region having a capability to conduct substantially all of majority carrier, or electron current in this example, from the cathode electrode 32 into the drift region 14. A metallized gate electrode 40 is applied to the gate member 38 and a gate terminal 42 can be applied to the gate electrode. Contacts or electrodes 20 and 32 are the power contacts or electrodes of this device.

As shown in FIG. 1, device current essentially comprises three separate components. The first component might be considered the majority carrier current comprising in this example electrons flowing from the cathode electrode 32 through the source region 30, through a N- type channel induced in the P base region 28 into the N drift layer 14 and possibly the N buffered region 16 to recombine with holes injected into the N buffer layer 16 and the N drift layer 14 from the anode terminal 20. A second component of the device current comprises the lateral hole current flowing from the P+ anode 18 through the N buffer region 16, the N drift region 14 into the P base region 28 laterally beneath the source region 30 and parallel to the surface of the device and then continuing in the base region 28 transverse to the plane of the surface of the device to the cathode terminal 32. A still further vertical component of the device current is established by the inherent PNP transistor existing between the anode terminal 20, the N buffer region 16 and the P substrate 12 when the P substrate is tied to a source of charge carrier such as ground.

Figure 2:
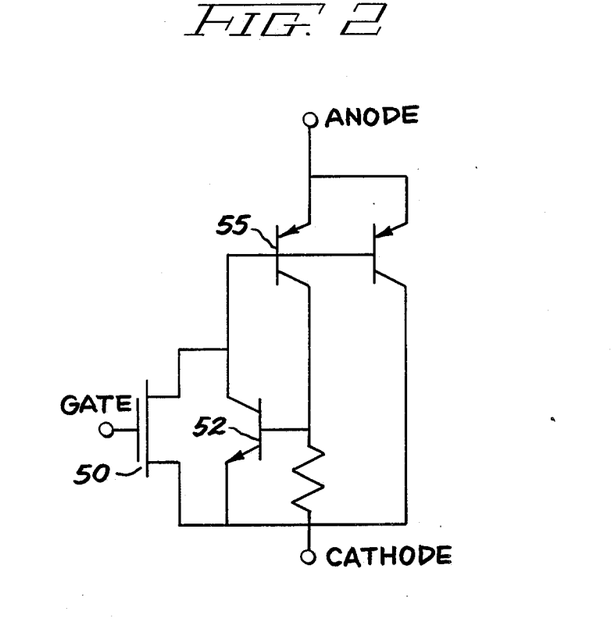
FIG. 2 is schematic diagram of an equivalent circuit of a conventional insulated gate transistor.

Referring now to FIG. 2, an equivalent circuit diagram of a typical insulated gate transistor is shown in schematic form to include a field effect transistor 50 connected between the cathode terminal 34 and the N drift region 14. An NPN transistor 52 comprising source region 30, base region 28, and drift region 14 is coupled between the cathode electrode 34 and the N base region 14 of a PNP transistor 55. The PNP transistor 55 accounts for the lateral hole current flow and is illustrated to comprise the P+ anode region 18 as the emitter, the N buffer region 16 in combination with the N drift region 14 as the base, and the P base region 28 as the lateral hole collector. The collector of the PNP transistor 55 is coupled to the base of the NPN electron transistor 52 and also to the cathode through a symbolic resistance R indicative of the resistance in base region 28. PNP transistor 57 is responsible for the control of vertical hole current and has as its emitter P+ anode region 18 which is coupled to the anode terminal 22, the N buffer region 16 as its base, and the P- substrate 12 as its collector which is coupled to ground.

Figure 3:
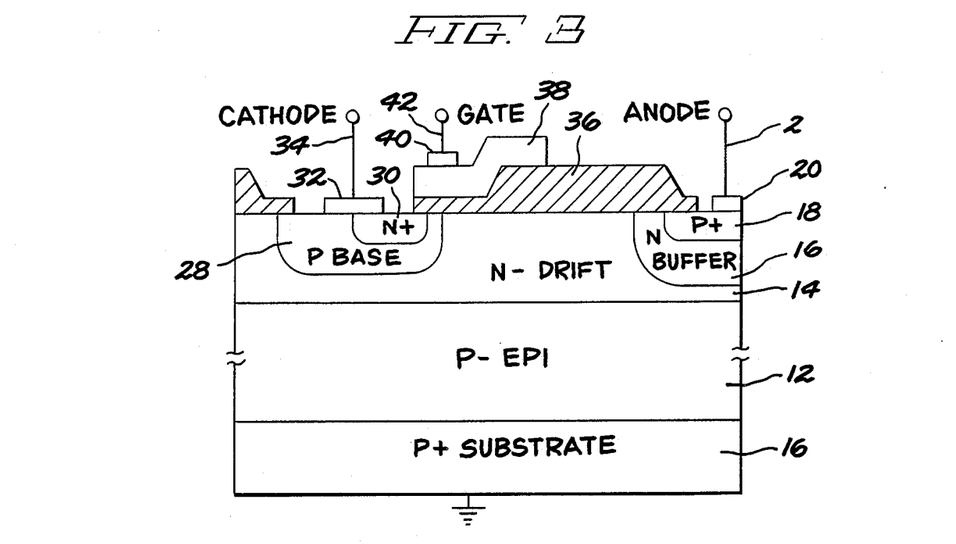
FIG. 3 is a cross-sectional view of an insulated gate transistor in accordance with the present invention having improved current conductivity.
Figure 4:
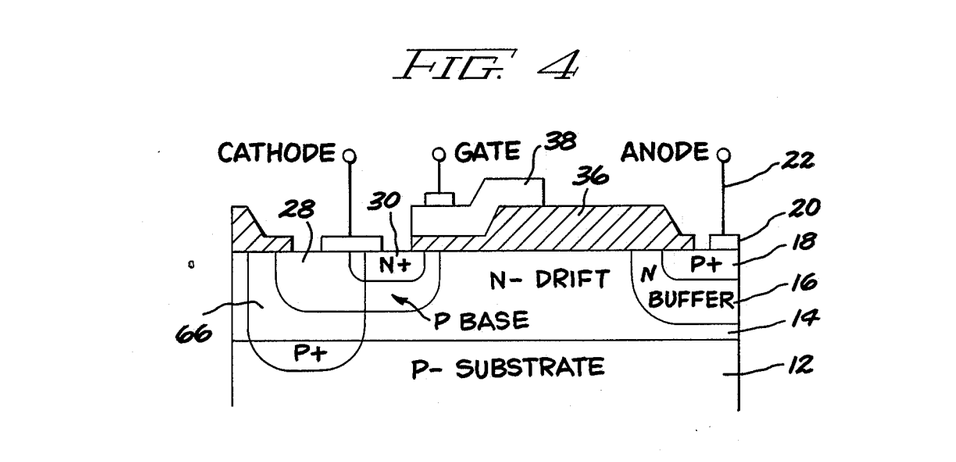
FIG. 4 is a cross-sectional view of an insulated gate transistor in accordance with the present invention having improved immunity to latching.
Figure 5:
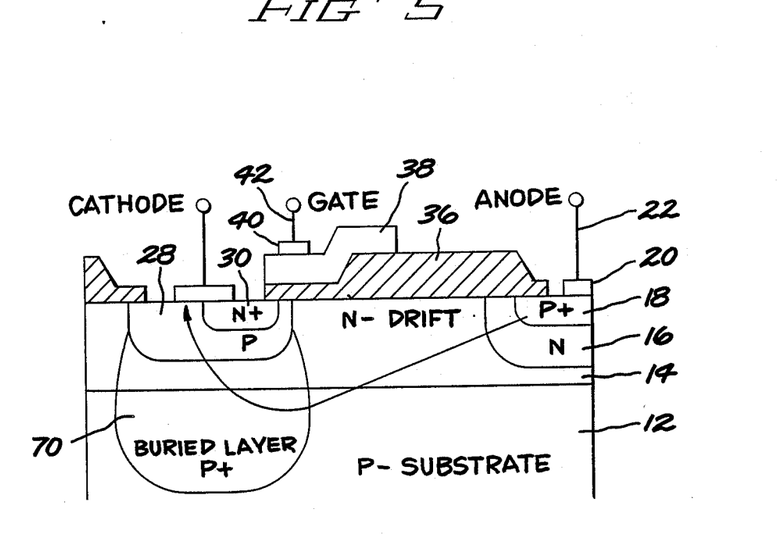
FIG. 5 is a cross-sectional view of an alternate preferred embodiment of the insulated gate transistor of the present invention, having improved immunity to latching.

Referring now to FIG. 3, it is recognized in the present invention that current density or current carrying capability of the lateral insulated gate transistor can be improved by the inclusion of a P+ substrate 60 to improve the conductivity of the vertical PNP transistor 57 (FIG. 2) and hence, improve the vertical hole current, and further, that the latching current level of the transistor can be increased as a result of the improvement in current conductivity. As illustrated in FIGS. 4 and 5, the latching immunity of the device 10 can also be improved by alternately providing low resistance current paths through the P base region 28 or low resistance current paths circumventing a portion of the P base 28. These improvements are discussed in more detail in combination with FIGS. 4-7 below.

In FIG. 3, an improved lateral insulated gate transistor 10 in accordance with a preferred embodiment of the present invention is shown. To facilitate an understanding of the present invention, similar reference numerals for corresponding parts have been carried forward. More particularly, the device includes an anode terminal 22, an anode contact 20, a P+ anode region 18, a lightly doped N buffer region 16, an N drift region 14, a P base region 28, and N+ source region 30, a cathode contact 32, and a cathode terminal 34. In this embodiment, however, the aforesaid lateral insulated gate transistor is disposed not a on a P− substrate 12 alone, but instead on the P+ substrate 60 with a P− layer 62 epitaxially disposed thereon. The P+ substrate provides a drain or sink for holes or minority carriers and has been found to contribute substantially to the collector current of the vertical transistor 57 and thus contribute substantially to the vertical component of the hole current operating in a lateral insulated gate transistor 10. In this example, the P+ substrate 60 is tied to a sink for hole carriers such as ground. By virtue of the improved vertical component, the current conducting capability or current density of the device is improved and thus can conduct higher levels of current before latching. Accordingly, the present insulated gate transistor device provides both improved current conduction and latching immunity.

The gate insulation layer 36 can be extended over the N buffer region 16 and the anode region 18 to ensure that surface contamination does not inadvertently lead to shorting of the junction between the P+ region 18 and the N buffer region 16. The N buffer region is provided to avoid punch through between the P+ anode and the P− epitaxial layer.

Referring now to FIG. 4, an improved lateral insulated gate transistor 10 in accordance with the present invention is shown in an alternate preferred embodiment. Although this device is illustrated to have been fabricated on a P− substrate 12, it will be recognized that a similar device can be fabricated on a P+ substrate 60 such as that employed in FIG. 3, to avail the device of the enhanced vertical hole current associated with the P+ substrate 60. In this embodiment, in addition to the anode 18, buffer 16, drift 14, base 28 and source 30 regions and gate 38 an additional P+ current control region 66 is disposed within the P− substrate 12 and the N drift region 14 and overlaps a portion of the P base 28 and the N+ source 30. The P+ region can be established by diffusion after an epitaxial growth of the N− layer and prior to the diffusion of the P base 28 or the N+ source region 30. In this embodiment, it is important to align the high conductivity region 66 to avoid substantial overlap of this region with the N+ source region since such overlap tends to degrade the performance of the source region 30. Accordingly, it is preferred that the P+ conductive region 66 be substantially laterally offset from the N+ source region. A major portion or substantially all of the P+ conductive region 66 does not underlie a major portion of the source region 30 and accordingly, has little or no effect on the lateral resistance of the minority carrier current path existing in the P base 28 beneath the source region 30. Instead, the highly conductive region 66 predominantly impacts upon that portion of the minority carrier current path transverse to the surface of the device existing between the cathode terminal 32 and the interface between the highly conductive region 66 and the P base 28. More particularly, the transverse portion of the minority carrier current path is rendered highly conductive by virtue of the overlap with the highly conductive region 66 and thus is less resistive. Accordingly, the IR voltage drop along this portion of the minority carrier path is reduced or is less than that which might otherwise be expected without this highly conductive region. Accordingly, the voltage drop along the interface between the P base region 28 and the N+ source region 30 is reduced thereby providing that device with improved latching immunity.

A still further alternate embodiment of the lateral insulated gate transistor 10 in accordance with the present invention is shown in FIG. 5 in cross-sectional form. As discussed above in connection with FIGS. 3 and 4, the embodiment of FIG. 5 can alternately be disposed on a P+ substrate to attain the benefits of the P+ substrate carrier injection contributing to an improvement in the vertical component of the hole current. However, for the sake of simplicity, the embodiment of FIG. 5 has been illustrated on a P− substrate 12. Again, given the similarity in appearance of the various regions of the device, like reference numerals have been carried forward to facilitate rapid understanding of the invention disclosed herein. More particularly, the device includes an anode terminal 22, an anode contact 20, an anode region 18, an N buffer region 16, an N drift region 14, a P base 28, an N+ source region 30, a cathode contact 32 and a cathode terminal 34. Further, an insulation layer 36 is disposed over a portion of the P base region 28 and the gate electrode 38 is disposed over a portion of the insulation layer 36 in registry with the P base 28. The gate contact 40 is applied to the gate 38 and a gate terminal 42 is applied to the gate contact 40. In this embodiment, the P− substrate is provided with a P+ buried layer 70 early in the fabrication process, as by diffusion. Subsequently, an N− layer 14 is preferably formed epitaxially on a P− substrate 12. The P+ buried layer is then diffused into the N− layer 14 so as to extend the P+ buried layer into the N− drift region 14 and form a graded junction with the P base region 28. Subsequently, a P base region 28 can be diffused from the upper surface of the epitaxial layer 14 and similarly, an N+ source region 30 can be diffused within the base region. In this embodiment, the highly conductive region, or buried layer 70, underlies substantially the entire P base region, but does not substantially overlap therewith. Specifically, the buried layer 70, which extends partially into P region 28, establishes a conductive path which is separated and spaced away from the base/source junction. As will become more apparent with reference to FIG. 7, lateral hole current flowing through the N drift layer, which might otherwise flow in the less conductive P base region 28 is induced to flow primarily through the highly conductive region 70 to laterally traverse a substantial portion of the base region 38.

More particularly, and as illustrated in FIG. 5, the N+ source region 30 shields a portion of the cathode contact 32 and thus carriers flowing in the lateral path of the buried region 70 are not influenced by the potential applied to the metal contact 32 which has thus been shielded. Accordingly, the highly conductive buried layer 70 provides a lateral current path from the edge of the P base region 28 to approximately the edge of the N+ region which is shielded from the cathode terminal potential. The minority carriers flow along a lateral path is substantially parallel to the surface of the device laterally beneath the P+ base portion of P base region 28. Once the minority carriers reach the unshielded portion of the buried layer and are exposed to the potential of the cathode, they are drawn more powerfully toward the cathode terminal 32 in a path transverse to the plane of the surface of the device. In this embodiment, the P+ buried layer 70 provides a highly conductive lateral current path having a low resistivity. The voltage drop across the minority carrier current path through the P+ buried region 70 is less than the drop which would otherwise occur in the P base region 28 under the conditions of the same current flow. Further, the voltage drop that does occur, is exhibited in the highly conductive region 70 and not along the junction between the source 30 and P base 28. Accordingly, the highly conductive P+ buried layer provides a reduced voltage drop along the PN junction between the P base 28 and the source region 30. The device 10 therefore exhibits a reduced tendency to latch or improved latching immunity. It has been found that the present embodiment involving the P+ buried layer provides a substantial improvement in the latching immunity of the device, and accordingly, is particularly preferred and is considered to provide a device which is current-limited by the channel conductivity rather than by the latching threshold.

It is to be understood in the above embodiment involving the highly conductive region 70, that the length of the minority carrier current path has been increased, reducing the forward voltage drop of the device.

Figure 6:
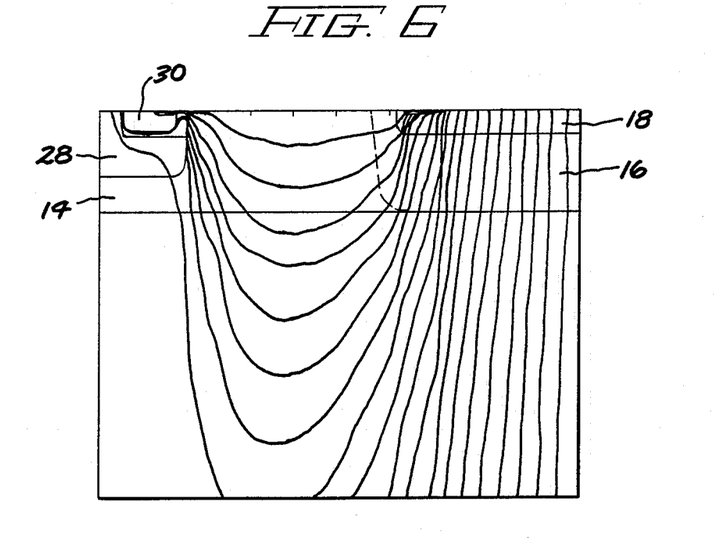
FIG. 6 is a plot of a current flow pattern from a conventional lateral insulated gate transistor such as that shown in FIG. 1.

Referring now to FIG. 6, a computer model of the total current flow pattern of the device 10 is illustrated as superimposed in various device regions. More particularly, FIG. 6 represents a conventional lateral insulated gate transistor 10 such as that shown in FIG. 1. The device current as discussed above, includes bilateral current flow between the source 30 and anode 20 terminals as well as a vertical component of minority carrier current flowing between the anode and substrate and a horizontal component of minority carrier current flowing between the anode and cathode. It is seen that a substantial portion of the hole current flows through the P base region 28 in FIG. 6.

Figure 7:
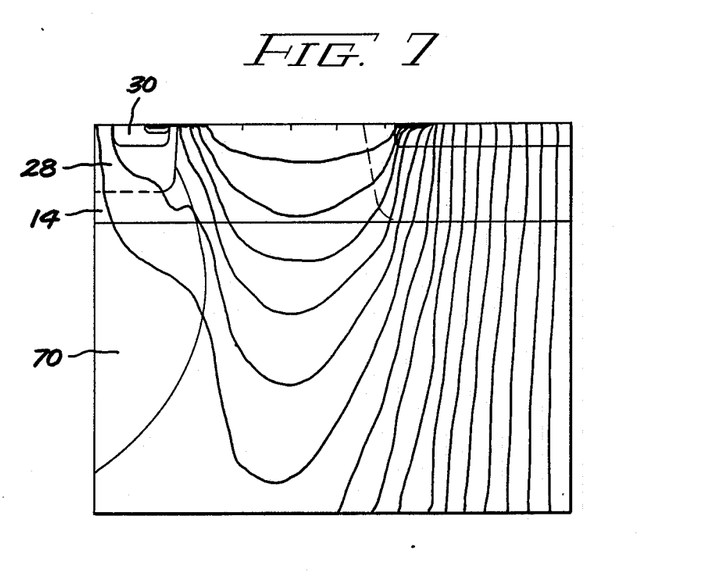
FIG. 7 is a plot of the current flow expected from the improved insulated gate transistor of FIG. 5.

Referring now to FIG. 7, a similar current flow pattern plot made with respect to the embodiment of FIG. 5 is seen. This figure shows a dramatic change in the flow of hole current. More particularly, hole current is seen to flow through the highly conductive region 70 laterally beneath and spaced from the PN base region 28 and the junction between the base region 28 and the source region 30. Accordingly, the voltage drop along the PN junction 28/30 is reduced contributing to improved latching immunity in the device.

Figure 8:
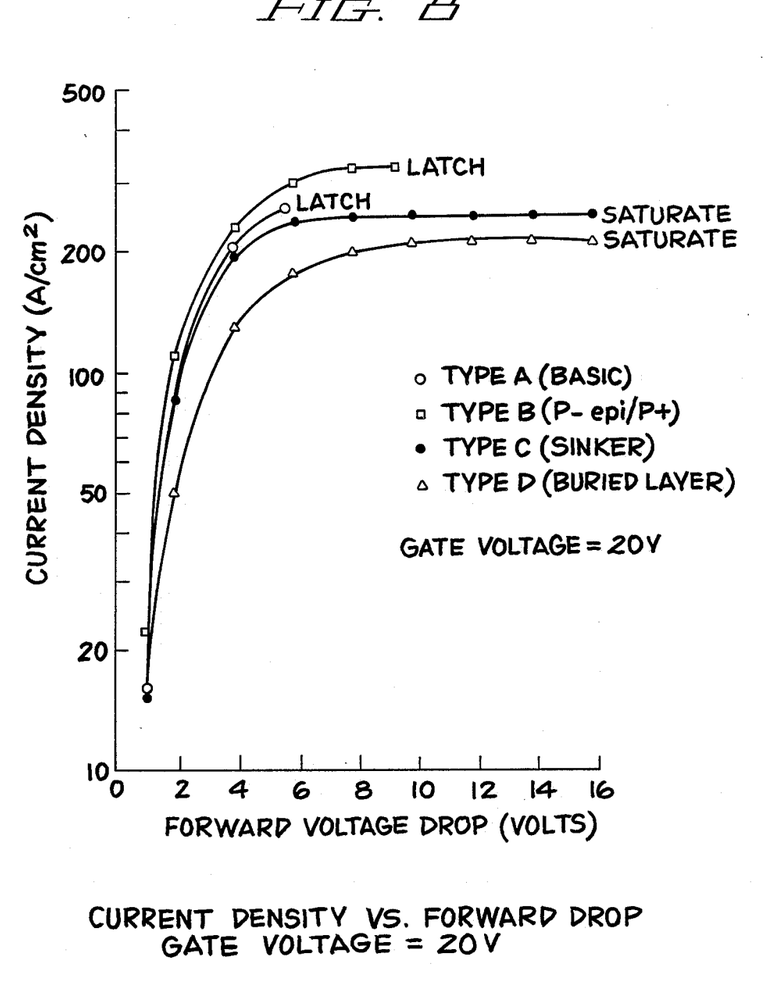
FIG. 8 is a plot of experimental results of current density vs forward drop for typical devices shown in FIGS. 1, 3, 4, and 5 when operated at a gate voltage of 20 volts.

FIG. 8 is an illustration of a comparison of the current density vs. forward drop characteristics of typical devices constructed in accordance with FIGS. 1, 3, 4, and 5 hereof and operated at gate voltages of 20 volts. In particular, devices of the type shown in FIGS. 1 and 3 latched at current densities in the order of 200-300 A/cm$^2$. In contrast, devices of the type illustrated in FIGS. 4 and 5 did not latch, but instead, the current of these devices is saturated.

Figure 9:
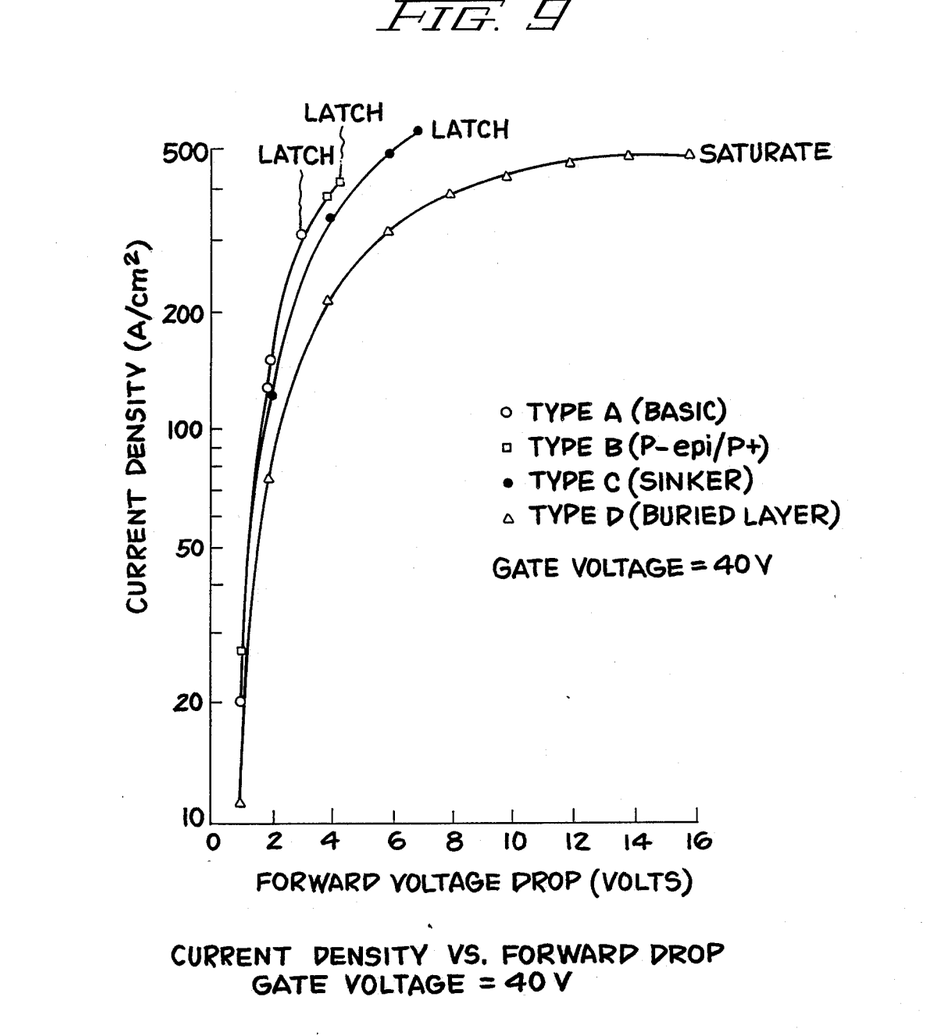
FIG. 9 is a plat of experimental results of current density vs. forward drop for typical devices shown in FIGS. 1, 3, 4, and 5 when operated at a 40 volt gate.

FIG. 9 is an illustration of a comparison of the current density vs. forward drop characteristics of typical devices in accordance with FIGS. 1, 3, 4, and 5 operated at a gate voltage of 40 volts. In particular, devices of the type shown in FIGS. 1, 3, and 4 were operated at increased current densities before latching occurred In contrast, devices of the type illustrated in FIG. 5 did not latch, but instead, the current of this device is saturated.

FIGS. 8 and 9 taken together, demonstrate unquestionably, that the diffused region 66 of FIG. 4 and the buried region 70 of FIG. 5 substantially improved the operating capability of the lateral insulated gate transistor 10 and particularly allows the insulated gate transistor to be operated at increased or higher current densities in the order of 500 A/cm$^2$.

Figure 10:
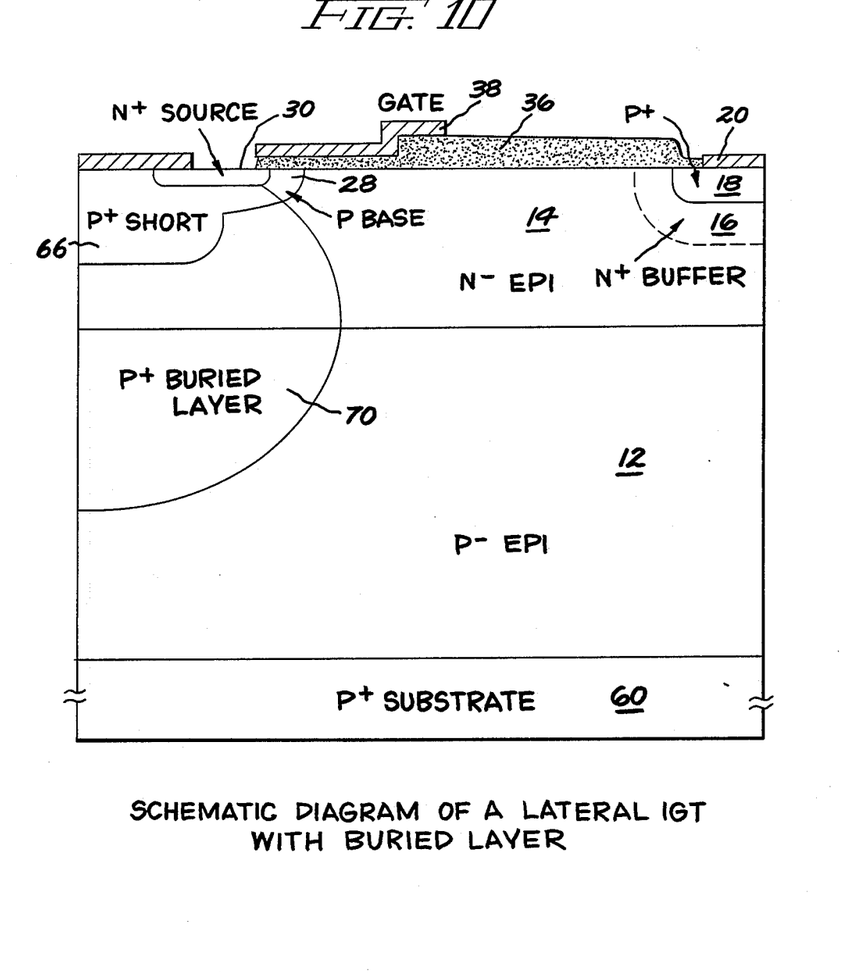
FIG. 10 is a cross-sectional illustration of a particularly preferred embodiment of a lateral insulated gate transistor in accordance with the present invention.

Referring now to FIG. 10, a particularly preferred embodiment of the lateral insulated gate transistor 10 of the present invention is illustrated in cross-section. This embodiment combines the beneficial features and aspects of the FIGS. 3, 4, and 5 embodiment to provide a device 10 having particularly enhanced current conducting capacity or improved current density as well as improved immunity to latching. This embodiment includes a heavily doped substrate layer 60 of one conductivity, such as the illustrated P+ layer having a thickness typically in the order of 20 mils. The heavily doped substrate layer 60 was discussed above in relation to FIG. 3, as providing, when connected to an appropriate potential, a drain for minority carriers or holes in the lateral device 10 to substantially increase the vertical component of the hole minority carrier current in the illustrated device.

Further, the device of FIG. 10 combines the heavily doped region 66 of FIG. 4 with the buried layer of FIG. 5 to reduce the resistivity of the base region and also provide an additional region separated or spaced from the base region, which additional region is highly conductive to minority carriers or holes in the illustrated example to divert holes away from the source 30, reducing the base/source junction IR voltage significantly. In this manner, the voltage drop across any portion of the source base junction is maintained at a voltage level well below the injection threshold, approximately 0.7 volts for silicon devices, necessary for the device to enter into regenerative latch-up and triggering the inherent four layer parasitic element of the device.

It is to be noted that the combination of the region 66 of FIG. 4 and 70 of FIG. 5 results in a heavily doped region 80 shown in FIG. 10 which substantially envelops or encloses all of the base region 28, except for a small portion of the P base 28 containing the gate induced channel indicated with reference numeral in dotted line.

The term "envelops" or "encloses" is used herein in its three dimensional sense. The heavily doped region 80 covers all surfaces of the base region other than the surface forming the surface of the device and a portion of the base region and the source region which drift interfaces the drift layer to the channel.

The combination of the highly doped region 66 with the buried layer 70 effectively alters and increases the conductivity of substantially the entire base region 28, except in a limited region of the P— base 28 surrounding the gate induced channel portion. The reduced resistivity or increased conductivity of the base region 28 abutting substantially all of the source region 30 consequently causes a reduced IR voltage drop along the base/source junction making the device less likely to latch at a given device current level. More importantly, however, reduced resistivity along the base/source junction allows the current level through the region 28 to be increased without increasing the IR voltage along the base/source junction to a level in excess of the forward bias or injection potential of the base/source junction.

Further, the configuration of the highly doped diversion regions 66 and 70 of FIGS. 4 and 5, respectively and particularly, region 70, establishes a highly conductive current path for minority carriers of the device, holes in the illustrated example, which most holes, traveling in the drift region 14 prefer over the corresponding path in the base 28. Accordingly, the heavily doped region 70 diverts holes away from the base region 28 to thereby reduce the I component of the IR voltage drop occurring along the base/source junction.

The combination of both the reduced resistivity current path adjacent a substantial portion of the base/source junction and the reduction of hole current flowing in this path proportionately increases the amount of hole or minority carrier current which can flow between the anode and cathode of the device. Accordingly, more current can flow through the device allowing the device to be operated at current densities well in excess of 500 A/cm$^2$ and approaching 1000 A/cm$^2$. In a particularly preferred embodiment, the resistivity of the base region 28 is lowered to such an extent, and the additional heavily doped region 70 diverts holes to an extent that the tendency of the base/source junction to latch is no longer the limiting factor of the device. Instead, the current capacity of the gate induced channel saturates or establishes the maximum current level of the device.

Figure 11:
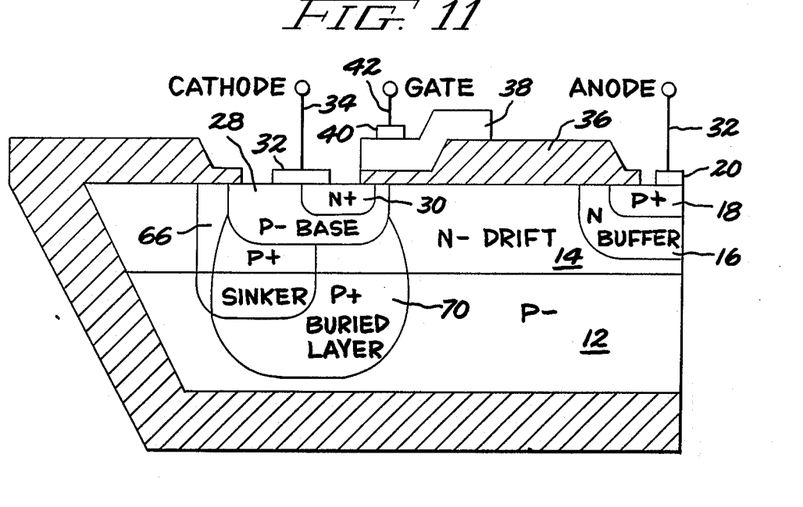
FIG. 11 is a cross-sectional illustration of an alternate preferred embodiment of the present invention employing a dielectrically isolated substrate.
Figure 12:
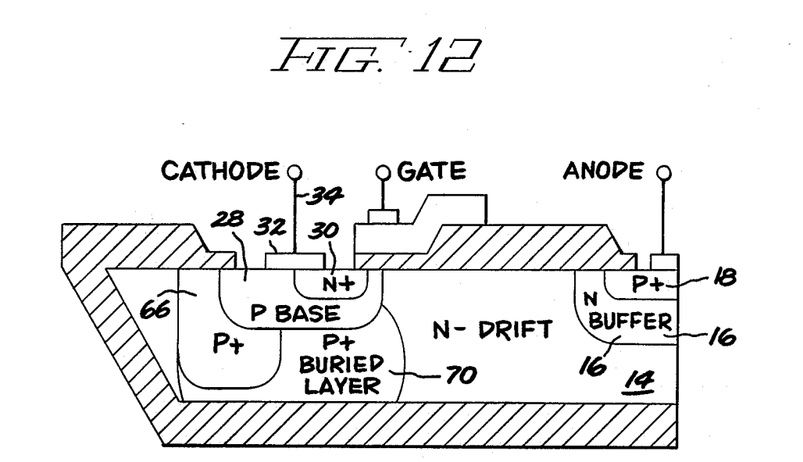
FIG. 12 is a cross-sectional illustration of an alternate preferred embodiment of the present invention on a dielectrically isolated substrate.

The aforementioned improvements including the reduced resistivity of the base region and highly conductive current path separated or spaced from the base region can also be applied to a device disposed on a dielectrically isolated substrate such as that shown in FIGS. 11 and 12.

In FIGS. 11 and 12, the lateral insulated gate transistor device with the buried layer 70 and heavily doped region 66 is shown on a dielectrically isolated substrate. The lateral insulated gate transistor structure without the buried layer 70 and the heavily doped region 66 would latch at a substantially lower current as the vertical current component for the junction isolated substrate is now absent. All the anode current is collected laterally by the cathode at the top surface of the device. The buried layer 70 and P+ heavily doped region 66 provides a low resistance path for the holes as discussed earlier and thus reducing the forward biasing of the source/base junction. This results in a lateral insulated gate transistor with improved current density and increased immunity from latch-up. The structures shown in FIGS. 11 and 12 can be realized by dielectric isolation process or alternatively a semiconductor on insulator process.

In the case of dielectrically isolated process, the P+ buried layer is implanted/diffused prior to the growth of the isolating oxide and growth of the polysilicon substrate. In the case that the device is made using a semiconductor an insulator process, the first layer over the isolating oxide must be kept thin ($<$b 1 $\mu$m) during the semiconductor an insulator process. In most of the candidate semiconductor on insulator processes (buried oxide or recrystallization) this tends to occur naturally. The P+ buried layer would then be implanted/diffused and an epitaxial layer subsequently grown on top.

By way of example, a lateral insulated gate transistor exhibiting a 350 volt forward voltage blocking peak in accordance with the present invention can be fabricated by conventional diffusion techniques discussed, for instance, by A. S. Grove, *Physics and Technology of Semiconductor Devices*, pages 35–78. More specifically, the P+ substrate 12 is heavily doped to approximately 1E19 atom/cc. The P— epitaxial layer 14 can be grown thereon and has a doping concentration of 2E14 atom/cc. A buried region 70 (with peak doping density of the order 1E18 A/cc) is typically established in the substrate layer prior to formation of the epitaxial layer 14. The P base region 28 typically has a concentration of 1E17 atom/cc while the source region 30 typically has a conductivity of approximately 5E19 atom/cc. The N buffer region 14 can have a concentration of approximately 5E14 atom/cc. The width of the buffer region is typically 25 microns and can be increased to, for instance, increase the beta of the device. For instance, a 35 micron device has a forward blocking voltage of approximately 500 volts. The insulation layer is typically 1000 Angstroms overlying the base and source regions and 7500 Angstroms overlying the drift region. The gate metal is typically 5000 Angstroms thick.

As discussed above, the improved lateral insulated gate device exhibiting improved latching immunity and improved current capacity in accordance with the present invention can be fabricated by employing conventional diffusion or implantation techniques to establish the above specified regions within the substrate. In a preferred embodiment, a method of forming an insulated gate transistor exhibiting improved currently conductivity immunity to latching and having a substantially planar surface in accordance with the present invention includes the steps of providing a heavily doped substrate layer of one type conductivity such as P type conductivity, establishing a heavily doped buried region of the one type conductivity in the substrate layer; forming a first lightly doped layer of the one conductivity on the substrate; forming a second lightly doped layer of the opposite type conductivity on the first layer; establishing a first region of the opposite type conductivity in the second lightly doped layer, the first region forming a portion of the substantially planar surface, establishing a second region of the one type conductivity in the first region, the second region forming a portion of the substantially planar surface; establishing a third region of the one type conductivity in the second lightly doped layer in substantial registry with the buried region, the third region forming a portion of the substantially planar surface; establishing a fourth region of the opposite type conductivity in the third region, the fourth region forming a portion of the substantially planar surface and defining a channel portion of the third region between the fourth region and the first layer proximate the surface; establishing a metallized electrode in registry with and in electrical contact with a portion of the third and fourth regions for inhibiting the forward biasing of the junction between the third and fourth regions; establishing an insulation layer over the channel portion; and establishing a gate metallization over the insulation layer for inducing a conductive channel in the channel portion; and causing the heavily doped region to diffuse from said substrate into the first and second lightly doped layers to establish in the second layer a diffused portion and a highly conductive path beneath and substantially laterally coextensive with the second region for diverting carriers into the conductive path in the diffused portion of the buried region.

It is recognized that the conductive path is formed substantially parallel to the substantially planar surface. In an alternate embodiment wherein a heavily doped diffused region is substituted for the heavily doped buried region. The conductive path formed by this method is substantially transverse to the substantially planar surface of the device.

It is to be understood that while the lateral insulated gate transistor has been described in a preferred embodiment, the invention itself is not so limited. Variations of the disclosed insulated gate device will be readily apparent to those skilled in the art. More particularly, the relative size, conductivity, and configuration of the device layers and regions can be varied over a broad range without departing from the spirit and scope of this invention. Further, the gate insulation and overlying gate layer can extend farther into the N source region 30 or N− drift region 14. While the substrate is shown as being coupled to ground, an alternate bias source can be employed to appropriately bias the vertical transistor 57.

While the preferred embodiment of the present invention has been illustrated and described, it is clear that the present invention is not so limited. Numerous modifications and changes, variation, substitutions, and equivalents will occur to those skilled in the art without departing from the true spirit and scope of the present invention. Accordingly it is intended that the invention herein be limited only by the scope of the appended claims.

What is claimed is:

1. A lateral insulated gate bipolar transistor having a substantially planar upper surface comprising:
   a substrate of one type conductivity;
   a first layer of said one type conductivity disposed contiguous to said substrate;
   a second layer of an opposite type conductivity disposed contiguous to said first layer and forming a portion of said upper surface of said device;
   a first region of said opposite type conductivity disposed within said second layer and forming a portion of said upper surface of said device;
   a second region of said one type conductivity disposed in said first region, spaced from said second layer and forming a portion of said upper surface;
   a third region of said one type conductivity disposed within said second layer, spaced from said first region, forming a portion of said upper surface and having a basic doping concentration;
   a fourth region of said opposite type conductivity disposed in said third region, forming a portion of said upper surface, spaced from said second layer to define a channel portion of said third region adjacent said upper surface between said fourth region and said second layer at the side of said fourth region toward said second region;
   an insulation layer disposed on said upper surface of said device and covering a portion of said third and fourth regions including said channel portion of said third region;
   a controllable gate electrode covering a portion of said insulation layer and aligned over at least said channel portion of said third region and responsive to an appropriate bias for inducing a channel in said channel portion of said third region coupling said second layer to said fourth region;
   a power electrode disposed over and in contact with portions of said third and fourth regions which are spaced from said channel portion of said third region and shorting said third region said fourth region to inhibit inadvertent forward biasing of the junction between said third and fourth regions; and
   additional one type conductivity determining dopant disposed in the vicinity of said third region, said additional dopant establishing a buried region for increasing the conductivity for carriers of said one type conductivity in the vicinity of said third region away from said junction between said third and fourth regions to above that provided by said basic doping concentration of said third region to establish a current path for said carriers of said one type conductivity away from the portion of said third region which is adjacent to the portion of said junction along the surface of said fourth region which is remote from said upper surface; wherein said additional dopant comprises a buried layer located in said first and second layers to provide a high conductivity path of said one type conductivity spaced away from said junction between said third and fourth regions.

2. A lateral insulated gate bipolar transistor having a substantially planar upper surface comprising:
   a substrate of one type conductivity;
   a first layer of said one type conductivity disposed contiguous to said substrate;
   a second layer of an opposite type conductivity disposed contiguous to said first layer and forming a portion of said upper surface of said device;
   a first region of said opposite type conductivity disposed within said second layer and forming a portion of said upper surface of said device;
   a second region of said one type conductivity disposed in said first region, spaced from said second layer and forming a portion of said upper surface;
   a third region of said one type conductivity disposed within said second layer, spaced from said first region, forming a portion of said upper surface and having a basic doping concentration;
   a fourth region of said opposite type conductivity disposed in said third region, forming a portion of said upper surface, spaced from said second layer to define a channel portion of said third region adjacent said upper surface between said fourth region and said second layer at the side of said fourth region toward said second region;
   an insulation layer disposed on said upper surface of said device and covering a portion of said third and fourth regions including said channel portion of said third region;
   a controllable gate electrode covering a portion of said insulation layer and aligned over at least said channel portion of said third region and responsive to an appropriate bias for inducing a channel in said channel portion of said third region coupling said second layer to said fourth region;

a power electrode disposed over and in contact with portions of said third and fourth regions which are spaced from said channel portion of said third region and shorting said third region said fourth region to inhibit inadvertent forward biasing of the junction between said third and fourth regions; and additional one type conductivity determining dopant disposed in the vicinity of said third region, said additional dopant establishing a buried region for increasing the conductivity for carriers of said one type conductivity in the vicinity of said third region away from said junction between said third and fourth regions to above that provided by said basic doping concentration of said third region to establish a current path for said carriers of said one type conductivity away from the portion of said third region which is adjacent to the portion of said junction along the surface of said fourth region which is remote from said upper surface; wherein said additional dopant comprises a further region of said one type conductivity which in major portion is adjacent and underlies a portion of said third region directly beneath said power electrode and is offset from said fourth region toward its side away from said channel region.

3. A lateral insulated gate bipolar transistor having a substantially planar upper surface comprising:

a substrate of one type conductivity;

a first layer of said one type conductivity disposed contiguous to said substrate;

a second layer of an opposite type conductivity disposed contiguous to said first layer and forming a portion of said upper surface of said device;

a first region of said opposite type conductivity disposed within said second layer and forming a portion of said upper surface of said device;

a second region of said one type conductivity disposed in said first region, spaced from said second layer and forming a portion of said upper surface;

a third region of said one type conductivity disposed within said second layer, spaced from said first region, forming a portion of said upper surface and having a basic doping concentration;

a fourth region of said opposite type conductivity disposed in said third region, forming a portion of said upper surface, spaced from said second layer to define a channel portion of said third region adjacent said upper surface between said fourth region and said second layer at the side of said fourth region toward said second region;

an insulation layer disposed on said upper surface of said device and covering a portion of said third and fourth regions including said channel portion of said third region;

a controllable gate electrode covering a portion of said insulation layer and aligned over at least said channel portion of said third region and responsive to an appropriate bias for inducing a channel in said channel portion of said third region coupling said second layer to said fourth region;

a power electrode disposed over and in contact with portions of said third and fourth regions which are spaced from said channel portion of said third region and shorting said third region said fourth region to inhibit inadvertent forward biasing of the junction between said third and fourth regions; and additional one type conductivity determining dopant disposed in the vicinity of said third region, said additional dopant establishing a buried region for increasing the conductivity for carries of said one type conductivity in the vicinity of said third region away from said junction between said third and fourth regions to above that provided by said basic doping concentration of said third region to establish a current path for said carriers of said one type conductivity away from the portion of said third region which is adjacent to the portion of said junction along the surface of said fourth region which is remote from said upper surface; wherein said additional dopant establishes a further region of said one type conductivity disposed in said first and second layers forming a high conductivity lateral path for lateral movement of said one type carries beneath said third region.

4. The lateral insulated gate bipolar transistor of claim 3 wherein:

said third region includes a path of said one conductivity type, a first portion of which is substantially parallel to the plane of said upper surface of said device and a second portion of which is transverse to said plane of said upper surface of said device, said first portion having a resistivity R1:

said lateral path in said further region having a resistivity R2 which is less than R1.

5. The lateral insulated gate bipolar transistor of claim 2 wherein said further region is a buried layer.

6. The lateral insulated gate bipolar transistor of claim 2 wherein said third region is disposed in said further region.

* * * * *